(12) United States Patent
Wang et al.

(10) Patent No.: US 7,143,312 B1
(45) Date of Patent: Nov. 28, 2006

(54) ALIGNMENT OF RECOVERED CLOCK WITH DATA SIGNAL

(75) Inventors: Shoujun Wang, Nepean (CA); Haitao Mei, Kanata (CA); Bill Bereza, Nepean (CA); Mashkoor Baig, Ottawa (CA); Tad Kwasniewski, Ottawa (CA)

(73) Assignee: Altera Corporation, San Jose, CA (US)

( * ) Notice: Subject to any disclaimer, the term of this patent is extended or adjusted under 35 U.S.C. 154(b) by 481 days.

(21) Appl. No.: 10/740,120

(22) Filed: Dec. 17, 2003

(51) Int. Cl.
  *G06F 11/00* (2006.01)
(52) U.S. Cl. ........................................ 714/30; 375/110
(58) Field of Classification Search ................ 714/30, 714/32, 39; 375/110, 119
See application file for complete search history.

(56) References Cited

U.S. PATENT DOCUMENTS

| | | | | |
|---|---|---|---|---|
| 3,473,160 | A | | 11/1969 | Wahlstrom .................... 326/41 |
| 4,486,739 | A | | 12/1984 | Franaszek et al. ............. 341/59 |
| 5,313,499 | A | * | 5/1994 | Coburn ....................... 375/361 |
| 5,566,204 | A | * | 10/1996 | Kardontchik et al. ....... 375/219 |
| 5,689,195 | A | | 11/1997 | Cliff et al. .................... 326/41 |
| 5,802,103 | A | | 9/1998 | Jeong ........................... 326/41 |
| 5,909,126 | A | | 6/1999 | Cliff et al. .................... 326/41 |
| 6,031,428 | A | | 2/2000 | Hill .............................. 331/11 |
| 6,215,326 | B1 | | 4/2001 | Jefferson et al. ............. 326/41 |
| 6,407,576 | B1 | | 6/2002 | Ngai et al. .................... 326/41 |
| 6,483,886 | B1 | | 11/2002 | Sung et al. .................. 375/376 |
| 6,614,314 | B1 | * | 9/2003 | d'Haene et al. ............ 331/1 A |
| 6,650,140 | B1 | | 11/2003 | Lee et al. ...................... 326/39 |
| 6,662,305 | B1 | * | 12/2003 | Salmon et al. .............. 713/401 |
| 6,724,328 | B1 | | 4/2004 | Lui et al. ..................... 341/101 |
| 6,750,675 | B1 | | 6/2004 | Venkata et al. ............... 326/41 |
| 6,771,105 | B1 | | 8/2004 | Andrasic et al. ............ 327/276 |
| 6,832,173 | B1 | * | 12/2004 | Starr et al. ................... 702/106 |
| 6,854,044 | B1 | | 2/2005 | Venkata et al. ............. 711/201 |
| 6,977,959 | B1 | * | 12/2005 | Brunn et al. ................. 375/219 |
| 2001/0033188 | A1 | | 10/2001 | Aung et al. ................. 327/141 |
| 2004/0140837 | A1 | | 7/2004 | Venakta et al. ............. 327/235 |
| 2004/0141577 | A1 | * | 7/2004 | Brunn et al. ................. 375/376 |
| 2005/0031065 | A1 | * | 2/2005 | Gupta et al. ................. 375/371 |

OTHER PUBLICATIONS

U.S. Appl. No. 10/059,014, filed Jan. 29, 2002, Lee et al.
U.S. Appl. No. 10/273,899, filed Oct. 16, 2002, Venkata et al.
U.S. Appl. No. 10/317,264, filed Dec. 10, 2002, Venkata et al.
U.S. Appl. No. 10/637,982, filed Aug. 8, 2003, Venkata et al.

(Continued)

*Primary Examiner*—Nadeem Iqbal
(74) *Attorney, Agent, or Firm*—Fish & Neave IP Group of Ropes & Gray LLP; Jeffrey H. Ingerman

(57) ABSTRACT

A recovered clock signal is aligned ("eye centered") with a data signal from which it is recovered by intentionally varying one of the factors or parameters that causes misalignment. For example, if a loop circuit (i.e., a phase-locked loop or a delay-locked loop) is used to recover the clock signal, charge pump current mismatch in the charge pump of the loop circuit is normally one factor in clock-data misalignment, and is also a parameter that can be manipulated. During a test mode, the current mismatch can be varied to obtain the best error rate, which signifies the best clock-data alignment. The test mode can be implemented using built-in self-test circuitry already on the device to transmit test data and then to receive it and analyze it for errors.

19 Claims, 5 Drawing Sheets

OTHER PUBLICATIONS

U.S. Appl. No. 10/668,900, filed Sep. 22, 2003, Asaduzzaman et al.
U.S. Appl. No. 10/672,901, filed Sep. 26, 2003, Asaduzzaman et al.
U.S. Appl. No. 10/713,877, filed Nov. 13, 2003, Churchill et al.
U.S. Appl. No. 10/722,665, filed Nov. 26, 2003, Wortman et al.
U.S. Appl. No. 10/739,445, filed Dec. 17, 2003, Kwasniewski et al.
Cook, Barry M., "IEEE 1355 Data-Strobe Links: ATM Speed at RS232 Cost", *Microprocessors and Microsystems*, Elsevier, UK, vol. 21, No. 7-8, pp. 421-428 (Mar. 30, 1998).
Konstas, Jason, "Converting Wide, Parallel Data Buses to High Speed Serial Links", *International IC '99 Conference Proceedings*, pp. 19-30 (1999).
Lemme, Helmuth, "Schnelle Chips Für Flaschenhälse," *Elektronik*, Franzis Verlag GMBH. Munchen, DE, vol. 40, No. 22, pp. 104-109 (Oct. 29, 1991).
"Lucent Introduces 10Gb/s Ethernet FPGAs", Programmable Logic News and Views, Electronic Trend Publications, Inc., vol. IX, No. 11, pp. 7-8 (Nov. 2000).
"ORCA ORT82G5 0.622/1.0-1.25/2.0-2.5/3.125 Gbits/s Backplane Interface FPSC", Lucent Technologies, Microelectronics Group, Product Brief, pp. 1-8 (Feb. 2001).
"ORCA ORT82G5 1.0-1.25/2.0-2.5/3.125 Gbits/s Backplane Interface FPSC", Preliminary Data Sheet, Agere Systems Inc., pp. 1-35 (Jul. 2001).
"ORCA ORT8850 Field-Programmable System Chip (FPSC) Eight-Channel x 850 Mbits/s Backplane Transceiver",Data Sheet, Agere Systems Inc., pp. 1-6 (Jul. 2001).
"ORCA ORT8850 Field-Programmable System Chip (FPSC) Eight-Channel x 850 Mbits/s Backplane Transceiver", Product Brief, Agere Systems Inc., pp. 1-6 (Jul. 2001).
"Protocol Independent Gigabit Backplane Transceiver Using Lucent ORT4622/ORT8850 FPSCs", Lucent Technologies, Microelectronics Group, Application Note, pp. 1-10 (Jun. 2000).
"Rocket I/O Transceiver User Guide", UG024 (v1.2), Xilinx, Inc. (Feb. 25, 2002).
"Virtex-II Pro Platform FPGA Handbook", UG012 (v1.0), pp. 1-6, 27-32, 121-126, and 162-180, Xilinx, Inc. (Jan. 31, 2002).
"Virtex-II Pro Platform FPGAs: The Platform for Programmable Systems", <http://www.xilinx.com/virtex2pro> (visited Mar. 5, 2002).

* cited by examiner

ALIGNMENT OF RECOVERED CLOCK WITH DATA SIGNAL

BACKGROUND OF THE INVENTION

This invention relates to the alignment of a recovered clock signal with a data signal, commonly referred to as "eye centering." More particularly, this invention relates to eye centering on a programmable logic device.

It is almost axiomatic that digital systems are clocked. For a clock of period T, the clock signal is typically a series of square (or rectangular) pulses of durations T/2, separated by zero-amplitude intervals of durations T/2. Such a clock has a rate or frequency of 1/T. The clock is used to time data signals, with each data pulse having a duration T. However, there is no reason why consecutive data pulses need be separated by zero-amplitude intervals. Therefore, two or more (n) consecutive data pulses can be transmitted as a single continuous "high" signal of duration nT. In each clock period T, one data pulse can be transmitted. Thus, the data rate of the system is the same as that of the clock rate. In a double data rate system, data is sampled on both rising and falling clock edges, resulting in a data rate twice that of the clock rate, with each data pulse having a duration T/2.

Because any particular data pulse can be either high ("1") or low ("0"), a train of unknown data pulses is commonly represented by two superposed waves, with the edges of the pulses are not purely vertical, so that the progression of pulses is distinctly visible. Each possible data position thus is shown as both high and low, signifying that either value is possible in a stream of actual data. Because the edges representing the pulse transitions in such a representation are not purely vertical, the intersecting inclined lines give each pulse position the appearance of an eye, and each pulse position is therefore referred to as a "data eye."

When sampling data, it is best that the sampling occur as close as possible to the center of the data eye, as far as possible from the transitions, because sampling during a transition could provide a false reading of the data, resulting in bit errors. However, when the clock must be recovered from the data, clock recovery errors, in combination with other errors such as process and temperature variations as well as clock/data delay variations, makes centering the sampling time in the data eye—"eye centering"—difficult or unreliable.

It would be desirable to be able to provide a method and circuitry for reliable eye centering in a recovered clock application.

SUMMARY OF THE INVENTION

The present invention achieves reliable eye centering by relying on the fact that at least one of the factors or parameters that give rise to clock-data alignment errors is adjustable. By deliberately adjusting that factor, the effects of the other factors can be cancelled out. In particular, in a clock data recovery application where the clock is recovered using a loop circuit, one of the factors that gives rise to alignment errors is charge pump current mismatch. Other factors include process and temperature variations as well as clock/data delay variations. Because charge pump current mismatch is not the only factor, charge pump current mismatch can be deliberately manipulated to control data alignment. In other types of applications, there may be other factors affecting data alignment that can be manipulated to control data alignment.

Thus, in a clock data recovery application, particularly in a programmable logic device, where a loop circuit (i.e., a phase-locked loop or a delay-locked loop) is used to recover the clock that is to be aligned with the data, the current sources in the charge pump of the loop circuit preferably are made variable, allowing the charge pump current mismatch to be manipulated. For example a variable current mirror as described below may be used.

The effectiveness of the present invention may be impacted by the type of phase detector used in the aforementioned loop circuit. The ability to change the clock-data alignment is more pronounced in the case of a linear phase detector (e.g., a Hogge detector). However, even nonlinear phase detectors (e.g., a bang—bang detector) typically have at least a small linear range, allowing the invention to operate.

In a preferred embodiment of a method according to the invention, a known data signal may be input to the clock data recovery circuit and the output signal monitored and compared to the known input signal. The charge pump current mismatch can be varied until the bit error rate between the input signal and the output signal is minimized. The charge pump current mismatch is then fixed at the value that minimized the bit error rate in the test signal. Preferably this comparison of input test data to output data is accomplished using built-in self-test circuitry on the device.

Therefore, in accordance with the present invention, there is provided a method of aligning a recovered clock with a data signal from which the clock was recovered, where misalignment of the data signal and the recovered clock results from at least one of a plurality of factors. The method includes varying the magnitude of one of the factors and analyzing the data signal as that one of said factors is varied. The varying and analyzing are repeated until error in the data signal is minimized. The magnitude of that one of the factors is then set to a value at which the error is minimized.

A clock data recovery circuit for use with the method, and a programmable logic device incorporating the clock data recovery circuit, are also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention provides reliable eye centering—i.e., clock-data alignment—by manipulating one of the factors that causes clock-data misalignment. Although the factor is something that one ordinarily would want to eliminate, the fact that it is not the only factor means that manipulating it can cancel out the effect of the other factors. Preferably, the factors that cause clock-data misalignment in a clock data recovery environment are charge pump current mismatch in the loop circuit of the clock data recovery circuitry, process and temperature variations, and clock/data delay variations, and the factor that preferably is manipulated in accordance with the present invention is charge pump current mismatch.

The invention will now be described with reference to FIGS. 1–5.

Figure 1:
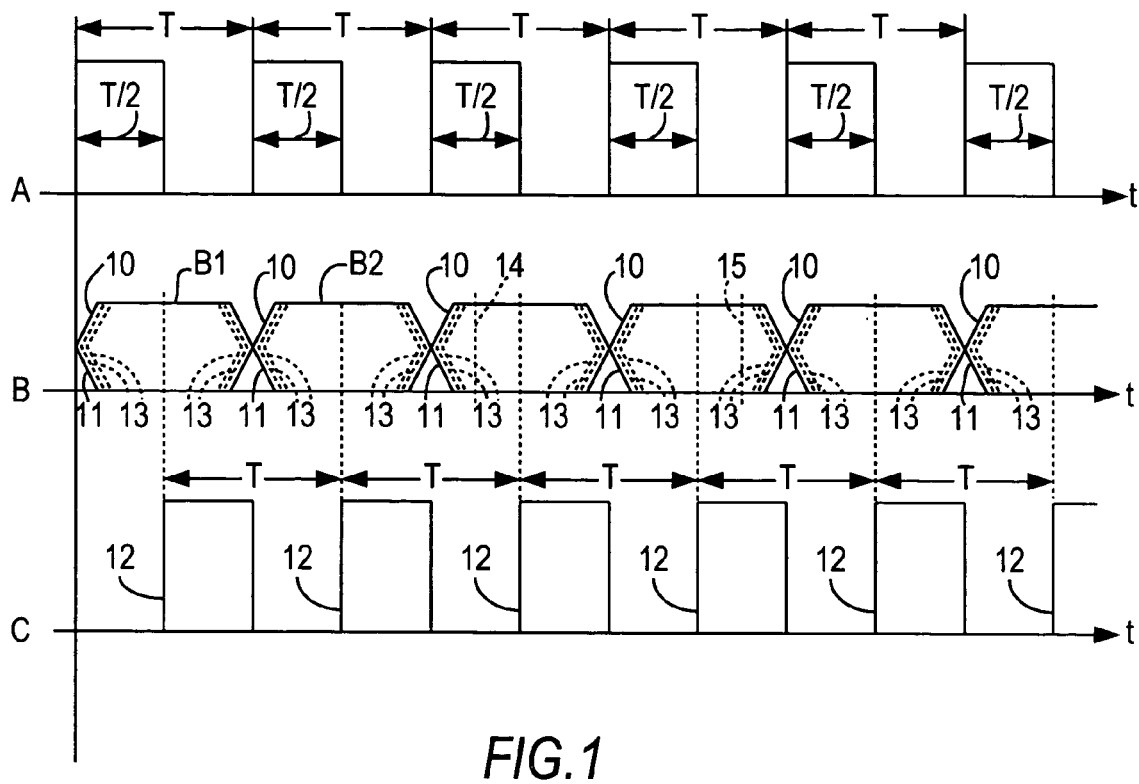
FIG. 1 is a set of timing diagrams showing clock and data signals as may be found in the present invention.
Figure 3:
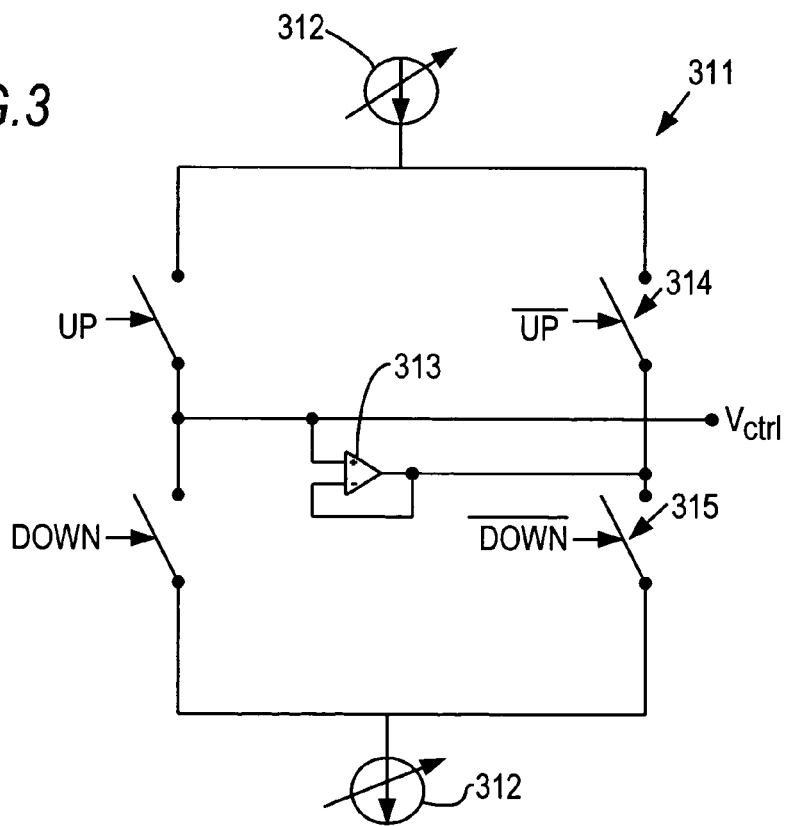
FIG. 3 is a simplified schematic diagram of a charge pump for use in the circuit of FIG. 2 in accordance with the present invention.

FIG. 1 shows as waveform A a clock having period T (i.e., a clock rate or frequency of 1/T). The clock signal preferably includes high intervals each of duration T/2, separated by low, or zero-amplitude, intervals also each of duration T/2 (although it is possible to imagine a clock with a different duty cycle that nevertheless has a period T). Waveform B shows a data pulse train clocked by waveform A. As discussed above, the data rate may be twice the clock rate. However, where the data rate equals the clock rate, each slot of duration T can accommodate a data pulse. Because when the data pulse train is considered in the abstract (as opposed to considering particular actual data), it is not known whether any particular pulse will be high or low, waveform B includes the superposition of trace B1 and trace B2. As can be seen, the appearance of the two potential pulses in each slot, particularly in view of inclined trace portions 10, 11, is that of an eye, and is referred to as a "data eye" as mentioned above.

Waveform C is a sampling clock having the same rate as the data rate of waveform B. Each data pulse is sampled on a rising edge 12. Therefore, ideally waveform C, which is the recovered data clock, is offset from waveform A so that rising edges 12 occur in the center of each data pulse slot. If a rising edge 12 were to occur to close to transitions 10, 11, then any uncertainty in the timing of the transitions, as indicated by dashed lines 13, may cause bit errors—e.g., the previous value of the datum in that slot, rather than its current value, might be read if the recovered clock is early, as indicated by dashed line 14. The same may occur if the recovered clock is late, as indicated by dashed line 15. Therefore, it is important to be able to adjust the recovered clock so that it falls in the center of each data eye.

Figure 2:
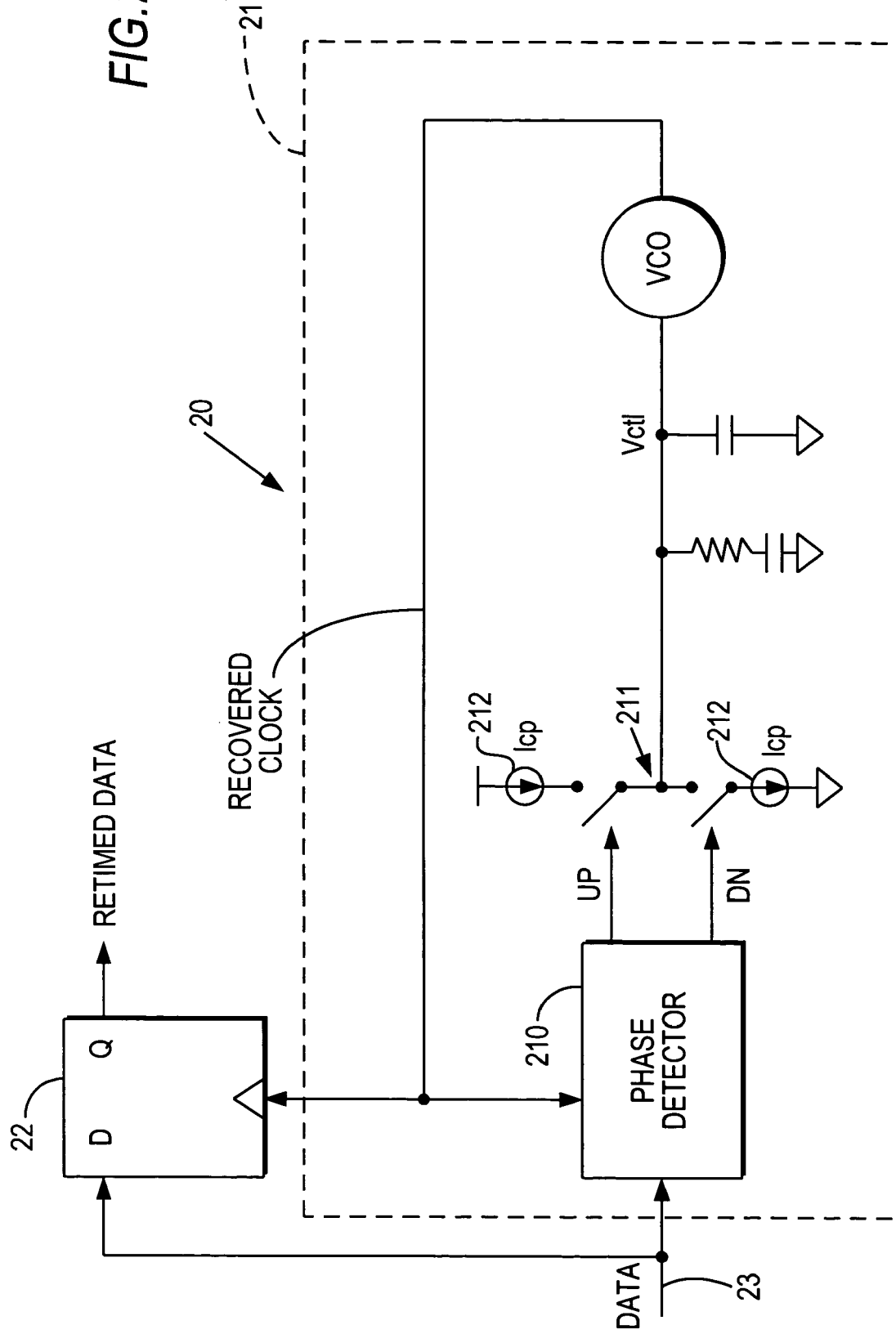
FIG. 2 is a simplified schematic diagram of a clock data recovery circuit with which the present invention may be used.

FIG. 2 shows a clock data recovery ("CDR") circuit 20 with which the present invention may be used. CDR circuit 20 preferably includes a loop circuit 21 (such as a phase-locked loop circuit, shown) and a decision circuit 22, which may be as simple as a D-type flip-flop (shown). As seen, data is input at 23 to both phase detector 210 of loop circuit 21 and to decision circuit 22, which is timed by the clock recovered from the data by loop circuit 21. As discussed above, various factors may affect the alignment of the recovered clock with the data. Among those factors is current mismatch between the two current sources 212 in charge pump 211 of loop circuit 21. While normally such current mismatch is something to be eliminated, in accordance with the present invention it is used to advantage. This is done by replacing charge pump 211 with adjustable charge pump 311 of FIG. 3.

Figure 4:
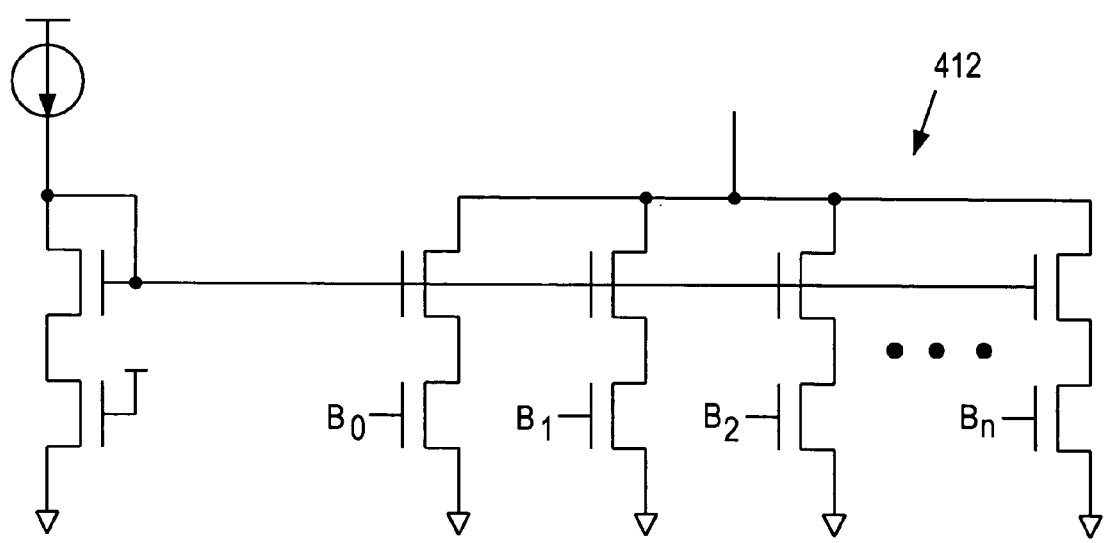
FIG. 4 is a schematic diagram of a variable current source for use in the charge pump of FIG. 3.

In charge pump 311, current sources 212 are replaced with adjustable current sources 312. In addition, unit gain buffer 313 and additional switches 314, 315 are provided to prevent charge sharing. Each adjustable current source 312 may be implemented as a variable current mirror 412 as shown in FIG. 4, where each leg $B_n$ can be turned on to increase the current. Each leg $B_n$ may have the same weight, so that the effect of adding an additional leg $B_n$ is linear, but preferably legs $B_n$ are binarily weighted, so that the effect of each additional leg $B_n$ is to double the current. Normally, the UP and DOWN current sources may be of NMOS and PMOS architectures, respectively. Current mirror 412 is an NMOS structure. The corresponding PMOS structure for the DOWN current source will be clear to one of ordinary skill in the art.

As stated previously, charge pump current mismatch is only one of several factors that contribute to clock-data misalignment. Other factors include process and temperature variations, as well as clock/data delay variations. However, once a particular device has been fabricated, and it is in its operating environment, most of the other factors become constants. Therefore, varying the charge pump current mismatch can be used to adjust the clock-data alignment. An arrangement for making that adjustment automatically, preferably using self-test circuitry that preferably is already present on the device, is shown in FIG. 5.

Figure 5:
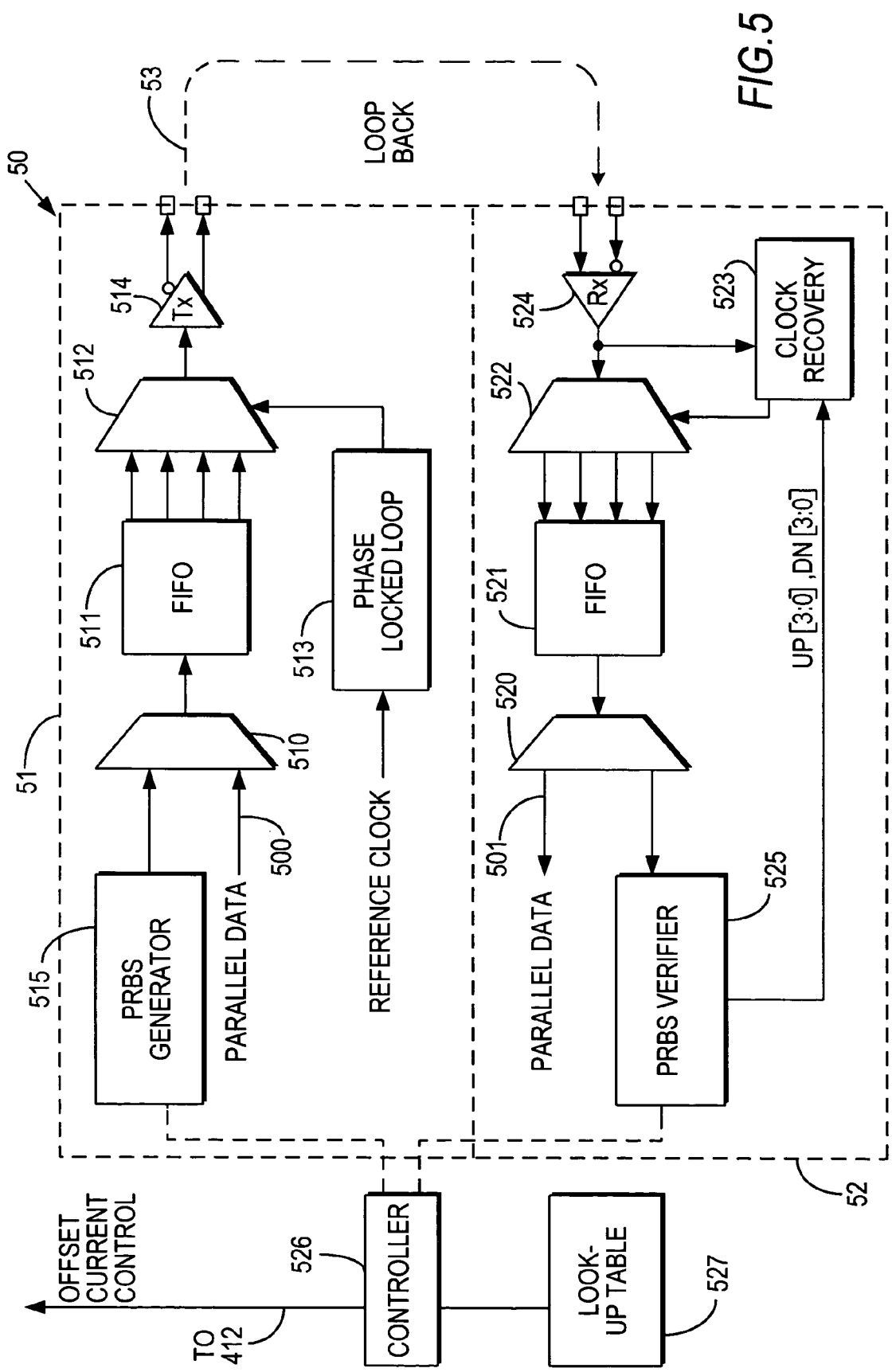
FIG. 5 is a schematic diagram of circuitry in accordance with the present invention that can be used for automatic adjustment of clock-data alignment.

FIG. 5 shows a high-speed serial interface 50 of a type that is becoming common in many electronic devices, including programmable logic devices, for implementing high-speed serial communications protocols. Interface 50 includes a transmitter stage 51 and a receiver stage 52. In transmitter stage 51, parallel data 500 from elsewhere on the device are selected by multiplexer 510 (whose purpose will become clear below) and are serialized by FIFO 511 and multiplexer 512 in accordance with a serial clock generated by phase-locked loop 513. The data are then transmitted off the device by transmit buffer 514, which is shown as a differential buffer because some of the high-speed signaling schemes are differential schemes, such as LVDS. A first-in, first-out (FIFO) buffer, also called an elastic buffer, may be used to compensate for phase variations across different clock domains.

In receiver stage 52, serial data are received from off the device by (differential) receive buffer 524. A clock is recovered from the data at 523, and used to deserialize the data in demultiplexer 522 and FIFO 521. The now-parallel data 501 are then selected by demultiplexer 520 (whose purpose will become clear below) and communicated to elsewhere on the device.

For self-test purposes, interface 50 preferably includes a pseudo-random bit sequence generator 515 which generates test data in a self-test mode. Those data are selected by multiplexer 510 and transmitted like real data 500 through a loop-back path 53 of known characteristics to receiver stage 52, where it is deserialized and directed by demultiplexer 520 to a verifier circuit 525 that compares it to the data generated by generator 515 and reports the bit error rate in the received data.

In accordance with the present invention, in order to determine the optimum charge pump current mismatch (or "offset," where, as here, the mismatch is intentional), the self-test circuitry can be operated while all values of current offset are tried, under control of a suitable controller 526. The bit error rate results can be stored, for each offset current value (each $B_n$ that is turned on), in look-up table 527. Afterwards, controller 526 can select from look-up table 527 the offset current value associated with the lowest bit error rate, and can adjust the offset current to that value. This procedure preferably should be repeated each time the device is powered up, as environmental factors contributing to clock-data misalignment—e.g., temperature—could be different.

Figure 6:
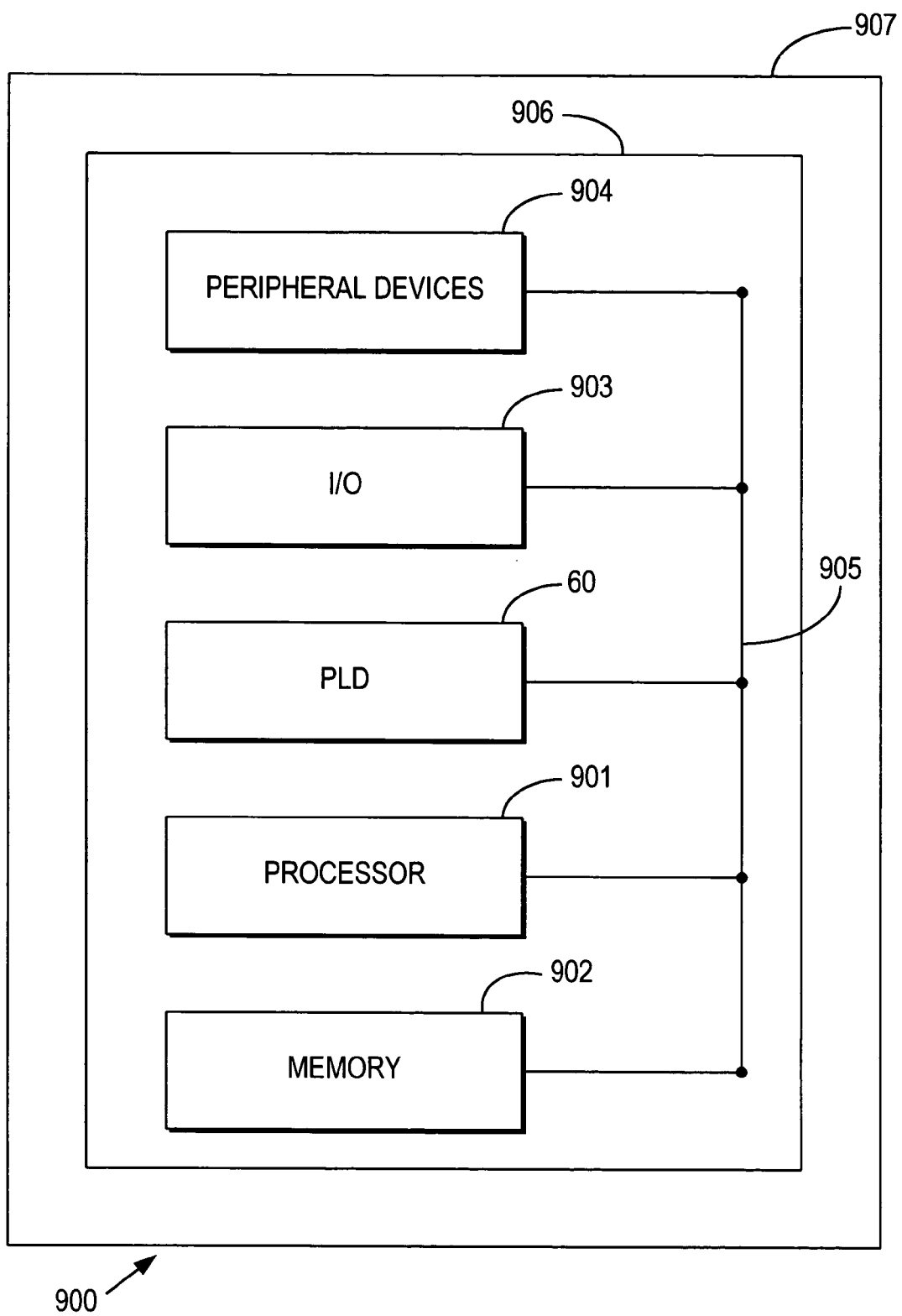
FIG. 6 is a schematic representation of a system including a programmable logic device incorporating the present invention.

A programmable logic device ("PLD") 60 incorporating clock data recovery circuitry according to the present invention may be used in many kinds of electronic devices. One possible use is in a data processing system 900 shown in FIG. 6. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 60 can be used to perform a variety of different logic functions. For example, PLD 60 can be configured as a processor or controller that works in cooperation with processor 901. PLD 60 may also be used as an arbiter for arbitrating access to a shared resources in system 900. In yet another example, PLD 60 can be configured as an interface between processor 901 and one of the other components in system 900. It should be noted that system 900 is only exemplary, and that the true scope and spirit of the invention should be indicated by the following claims.

Various technologies can be used to implement PLDs 60 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method of aligning a recovered clock with a data signal from which said clock was recovered, where misalignment of said data signal and said recovered clock results from at least one of a plurality of factors separate from said data signal, said method comprising:
   varying magnitude of one of said factors separate from said data signal and analyzing said data signal as said one of said factors separate from said data signal is varied;
   repeating said varying and said analyzing until error in said data signal is minimized; and
   setting said magnitude of said one of said factors separate from said data signal to a value at which said error is minimized.

2. The method of claim 1 wherein:
   said clock is recovered using a loop circuit including a charge pump, and said one of said factors separate from said data signal is charge pump current mismatch.

3. The method of claim 2 wherein said analyzing comprises:
   propagating a known data signal; and
   measuring error arising during propagation of said known data signal.

4. A clock data recovery circuit comprising:
   an input for receiving a data signal;
   a loop circuit connected to said input for recovering a clock from said data signal; and
   a decision circuit connected to said input and receiving said recovered clock, for recovering said data signal; wherein:
   said loop circuit has a variable characteristic, separate from said data signal, that affects alignment of said recovered clock and said data, said alignment being affected also by other factors separate from said data signal; whereby:
   adjustment of said variable characteristic separate from said data signal compensates for said other factors separate from said data signal, thereby aligning said recovered clock and said data.

5. The clock data recovery circuit of claim 4 further comprising:
   testing circuitry for receiving known data, retransmitting said known data, and comparing said retransmitted known data with said known data.

6. The clock data recovery circuit of claim 5 further comprising:
   adjustment circuitry for using results of said comparing to adjust said variable characteristic separate from said data signal, thereby adjusting said alignment.

7. The clock data recovery circuit of claim 6 wherein:
   said variable characteristic separate from said data signal is charge pump current mismatch; and
   said adjustment circuitry comprises a variable current mirror.

8. The clock data recovery circuit of claim 4 further comprising:
   adjustment circuitry for adjusting said variable characteristic separate from said data signal, thereby adjusting said alignment.

9. The clock data recovery circuit of claim 8 wherein:
   said variable characteristic separate from said data signal is charge pump current mismatch; and
   said adjustment circuitry comprises a variable current mirror.

10. A programmable logic device comprising the clock data recovery circuit of claim 4.

11. A digital processing system comprising:
    processing circuitry;
    a memory coupled to said processing circuitry; and
    a programmable logic device as defined in claim 10 coupled to the processing circuitry and the memory.

12. A printed circuit board on which is mounted a programmable logic device as defined in claim 10.

13. The printed circuit board defined in claim 12 further comprising:
    memory circuitry mounted on the printed circuit board and coupled to the programmable logic device.

14. The printed circuit board defined in claim 13 further comprising:
    processing circuitry mounted on the printed circuit board and coupled to the memory circuitry.

15. An integrated circuit device comprising the clock data recovery circuit of claim 4.

16. A digital processing system comprising:
    processing circuitry;
    a memory coupled to said processing circuitry; and
    an integrated circuit device as defined in claim 15 coupled to the processing circuitry and the memory.

17. A printed circuit board on which is mounted an integrated circuit device as defined in claim 15.

18. The printed circuit board defined in claim 17 further comprising:
    memory circuitry mounted on the printed circuit board and coupled to the integrated circuit device.

19. The printed circuit board defined in claim 18 further comprising:
    processing circuitry mounted on the printed circuit board and coupled to the memory circuitry.

* * * * *